(12) United States Patent
Ueda et al.

(10) Patent No.: US 12,336,431 B2
(45) Date of Patent: Jun. 17, 2025

(54) METHOD OF MANUFACTURING PIEZOELECTRIC ELEMENT, METHOD OF MANUFACTURING ELECTRONIC DEVICE, PIEZOELECTRIC ELEMENT, AND ELECTRONIC DEVICE

(71) Applicant: CANON KABUSHIKI KAISHA, Tokyo (JP)

(72) Inventors: Miki Ueda, Tokyo (JP); Takanori Matsuda, Tokyo (JP); Tatsuo Furuta, Tokyo (JP); Hisato Yabuta, Tokyo (JP); Akira Uebayashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 946 days.

(21) Appl. No.: 17/345,259

(22) Filed: Jun. 11, 2021

(65) Prior Publication Data

US 2021/0305492 A1 Sep. 30, 2021

Related U.S. Application Data

(63) Continuation of application No. PCT/JP2019/049855, filed on Dec. 19, 2019.

(30) Foreign Application Priority Data

Dec. 21, 2018 (JP) .................. 2018-240156

(51) Int. Cl.
  *H10N 30/045* (2023.01)
  *C04B 35/468* (2006.01)
  *H10N 30/853* (2023.01)

(52) U.S. Cl.
  CPC ....... *H10N 30/045* (2023.02); *C04B 35/4682* (2013.01); *H10N 30/8536* (2023.02); *C04B 2235/765* (2013.01); *C04B 2235/768* (2013.01)

(58) Field of Classification Search
  CPC ............ H10N 30/045; H10N 30/8536; H10N 30/097; C04B 35/4682; C04B 35/49;
  (Continued)

(56) References Cited

U.S. PATENT DOCUMENTS 7,679,270 B2  3/2010 Nakamura
7,906,889 B2  3/2011 Furuta et al.
(Continued)

FOREIGN PATENT DOCUMENTS

JP   11-060334 A   3/1999
JP   2000-072539 A   3/2000
(Continued)

OTHER PUBLICATIONS

Budimir et.al., Piezoelectric anisotropy-phase transition relations in perovskite single crystals, J. Appl. Phys. 94, 6753-6761 (2003) (Year: 2003).*

(Continued)

*Primary Examiner* — Jeffrey T Carley
*Assistant Examiner* — Jose K Abraham
(74) *Attorney, Agent, or Firm* — Venable LLP

(57) ABSTRACT

A piezoelectric material having a large electromechanical coupling coefficient is provided. The material is manufactured by a method including the steps of: heating a piezoelectric material having a low-temperature side ferroelectric phase A and a high-temperature side ferroelectric phase B between which the phase of the piezoelectric material transitions according to a temperature change, from room temperature to a temperature range higher than $T_{(B \to A)}$ at which temperature a change from the ferroelectric phase B to the ferroelectric phase A occurs in a temperature lowering process and lower than $T_{(A \to B)}$ at which temperature a change from the ferroelectric phase A to the ferroelectric phase B occurs in a temperature rising process; starting (Continued)

application of an electric field to the piezoelectric material in a state where it is held within this temperature range; and continuing and finishing the electric field application at a temperature lower than $T_{(A \to B)}$.

10 Claims, 7 Drawing Sheets

(58) Field of Classification Search
CPC ...... C04B 2235/3249; C04B 2235/765; C04B 2235/768; C04B 2235/3215; C04B 2235/3232; C04B 2235/3244; C04B 2235/3262; B06B 1/06; C01G 23/00
See application file for complete search history.

(56) References Cited

U.S. PATENT DOCUMENTS

| | | | |
|---|---|---|---|
| 9,022,534 B2 | 5/2015 | Yabuta et al. | |
| 9,231,188 B2 | 1/2016 | Suzuki et al. | |
| 9,252,685 B2 | 2/2016 | Ifuku et al. | |
| 9,306,150 B2* | 4/2016 | Tanaka | B41J 2/1607 |
| 9,509,235 B2* | 11/2016 | Furuta | H02N 2/142 |
| 9,515,249 B2* | 12/2016 | Hayashi | C04B 35/49 |
| 9,614,141 B2 | 4/2017 | Shimizu et al. | |
| 9,842,985 B2 | 12/2017 | Suzuki et al. | |
| 9,887,347 B2 | 2/2018 | Kubota et al. | |
| 9,893,269 B2* | 2/2018 | Ifuku | H10N 30/045 |
| 9,917,245 B2 | 3/2018 | Kubota et al. | |
| 9,981,292 B2* | 5/2018 | Matsuda | B41J 2/161 |
| 10,074,796 B2* | 9/2018 | Ueda | H10N 30/50 |
| 10,424,722 B2 | 9/2019 | Matsuda et al. | |
| 10,727,395 B2 | 7/2020 | Yabuta et al. | |
| 11,201,571 B2* | 12/2021 | Hayashi | H10N 30/045 |
| 11,706,988 B2* | 7/2023 | Ikeuchi | H03H 3/0072 |
| 2009/0121588 A1* | 5/2009 | Yamaguchi | C01G 33/006 |
| | | | 310/358 |
| 2009/0230211 A1* | 9/2009 | Kobayashi | B41J 2/1646 |
| | | | 252/62.9 PZ |
| 2012/0161578 A1* | 6/2012 | Shimada | H10N 30/8542 |
| | | | 310/317 |
| 2014/0125199 A1* | 5/2014 | Furuta | H02N 2/163 |
| | | | 29/25.35 |
| 2014/0218588 A1* | 8/2014 | Ifuku | H10N 30/85 |
| | | | 348/340 |
| 2014/0285061 A1* | 9/2014 | McKinley | H10N 15/10 |
| | | | 310/306 |
| 2015/0015121 A1* | 1/2015 | Watanabe | H10N 30/2047 |
| | | | 310/365 |
| 2015/0015642 A1* | 1/2015 | Tanaka | H10N 30/2047 |
| | | | 359/507 |
| 2015/0042210 A1* | 2/2015 | Nagareda | B06B 1/0644 |
| | | | 29/25.35 |
| 2015/0053885 A1* | 2/2015 | Saito | H01L 21/64 |
| | | | 15/94 |
| 2015/0141834 A1* | 5/2015 | Minemoto | C04B 35/462 |
| | | | 29/25.35 |
| 2015/0155473 A1* | 6/2015 | Watanabe | H10N 30/50 |
| | | | 15/94 |
| 2015/0349238 A1* | 12/2015 | Matsuda | B41J 2/14274 |
| | | | 29/25.35 |
| 2015/0349666 A1* | 12/2015 | Ifuku | H10N 30/8536 |
| | | | 29/25.35 |
| 2015/0353431 A1* | 12/2015 | Ueda | H02N 2/001 |
| | | | 310/365 |
| 2016/0288166 A1* | 10/2016 | Rubel | B06B 1/0215 |
| 2016/0315245 A1* | 10/2016 | Kubota | B08B 7/02 |
| 2017/0040528 A1* | 2/2017 | Furuta | H10N 30/8542 |
| 2017/0059378 A1* | 3/2017 | Nagareda | G01F 1/667 |
| 2018/0123018 A1* | 5/2018 | Ueda | C04B 35/62695 |

FOREIGN PATENT DOCUMENTS

| | | | | |
|---|---|---|---|---|
| JP | 2005228865 A * | 8/2005 | | |
| JP | 2009-82385 A | 4/2009 | | |
| JP | 2016-006858 A | 1/2016 | | |
| WO | WO-2014002286 A1 * | 1/2014 | ........... | B06B 1/0644 |
| WO | WO-2016157855 A1 * | 10/2016 | .......... | B41J 2/14274 |
| WO | 2020/130083 A1 | 6/2020 | | |

OTHER PUBLICATIONS

Notice of Reasons for Refusal in Japanese Application No. 2020-223940 (Mar. 2024).
Notice of Reasons for Refusal in Japanese Application No. 2020-223940 (Oct. 2023).
International Preliminary Report on Patentability in International Application No. PCT/JP2019/049855 (Jul. 2021).
Saburo Nagakura et al. (ed.), Iwanami Physicochemical Dictionary, 5th Edition, p. 1268-1269 (Iwanami Shoten, Publishers; Feb. 20, 1998).
Shunsuke Murakami et al., "Effects of Poling Termination and Aging Process On Piezoelectric Properties of Mn-Doped BaTi0. 96Zr0.04O3 Ceramics," 54 Jpn. J. Appl. Phys. 10ND05, pp. 1-5 (Sep. 2015).
International Search Report in International Application No. PCT/JP2019/049855 (Mar. 2020).

* cited by examiner

METHOD OF MANUFACTURING PIEZOELECTRIC ELEMENT, METHOD OF MANUFACTURING ELECTRONIC DEVICE, PIEZOELECTRIC ELEMENT, AND ELECTRONIC DEVICE

CROSS-REFERENCE TO RELATED APPLICATIONS

This application is a Continuation of International Patent Application No. PCT/JP2019/049855, filed Dec. 19, 2019, which claims the benefit of Japanese Patent Application No. 2018-240156, filed Dec. 21, 2018, both of which are hereby incorporated by reference herein in their entirety.

BACKGROUND OF THE INVENTION

Field of the Invention

The present invention relates to a method of manufacturing a piezoelectric element and relates in particular to a method of manufacturing a lead-free piezoelectric element containing no lead and a method of manufacturing an electronic device using the piezoelectric element. In addition, the present invention relates to a piezoelectric element and an electronic device.

Description of the Related Art $ABO_3$ perovskite-type metal oxides such as lead zirconate titanate (hereinafter referred to as "PZT") are common as piezoelectric materials. However, since PZT contains lead as the A-site element, its impact on the environment has been considered a problem. For this reason, there have been demands for piezoelectric materials using a perovskite-type metal oxide containing no lead.

Barium titanate has been known as a piezoelectric material with a perovskite-type metal oxide containing no lead. Moreover, to enhance its properties, materials based on the composition of barium titanate have been developed.

Japanese Patent Application Laid-Open No. H11-060334 discloses a technique of adjusting the composition of barium titanate by substituting Zr for some B sites therein to thereby raise a phase transition temperature $T_{to}$ to a room temperature range. Specifically, a piezoelectric material is disclosed which exhibits a good piezoelectric property (piezoelectric constant) at around room temperature by utilizing the maximization of permittivity via the phase transition that occurs under room temperature. Also, Japanese Journal of Applied Physics 54, 10ND05 (2015) has reported a change in properties of a material system in which Zr is substituted for some B sites in barium titanate and also Mn is added as a result of varying the temperature at which to finish a polarization treatment.

Electronic devices using a piezoelectric element include, for example, ultrasonic vibrators including ultrasonic probes, ultrasonic cleaners, and the like, piezoelectric buzzers, ceramic filters, and so on, and have been widely used. Since these electronic devices convert electrical energy into mechanical energy and use it, they require a large electromechanical coupling coefficient.

However, the value of the electromechanical coupling coefficient of the piezoelectric material in Japanese Journal of Applied Physics 54,10ND05 (2015) is not sufficiently large. Assuming application to, for example, an ultrasonic probe, a large electromechanical coupling coefficient is required in a temperature range of, for example, about 0 to 60° C.

The present invention has been made to address the above problem, and provides a method of manufacturing a piezoelectric element having a larger electromechanical coupling coefficient in a practical temperature range.

SUMMARY OF THE INVENTION

A solution to the above problem is a method of manufacturing a piezoelectric element having an electrode and a piezoelectric material, the piezoelectric material having a low-temperature side ferroelectric phase A and a high-temperature side ferroelectric phase B between which a phase of the piezoelectric material transitions according to a temperature change, the method including the steps of, with $T_{(B \to A)}$ being a temperature at which a change from the ferroelectric phase B to the ferroelectric phase A occurs in a temperature lowering process and $T_{(A \to B)}$ being a temperature at which a change from the ferroelectric phase A to the ferroelectric phase B occurs in a temperature rising process:

raising a temperature of the piezoelectric material having the electrode from room temperature to a temperature range higher than $T_{(B \to A)}$ and lower than $T_{(A \to B)}$;

starting application of an electric field to the piezoelectric material in a state where the piezoelectric material is held within the temperature range; and continuing and finishing the application of the electric field at a temperature lower than $T_{(A \to B)}$.

Further features of the present invention will become apparent from the following description of exemplary embodiments with reference to the attached drawings.

DESCRIPTION OF THE EMBODIMENTS

Figure 1:
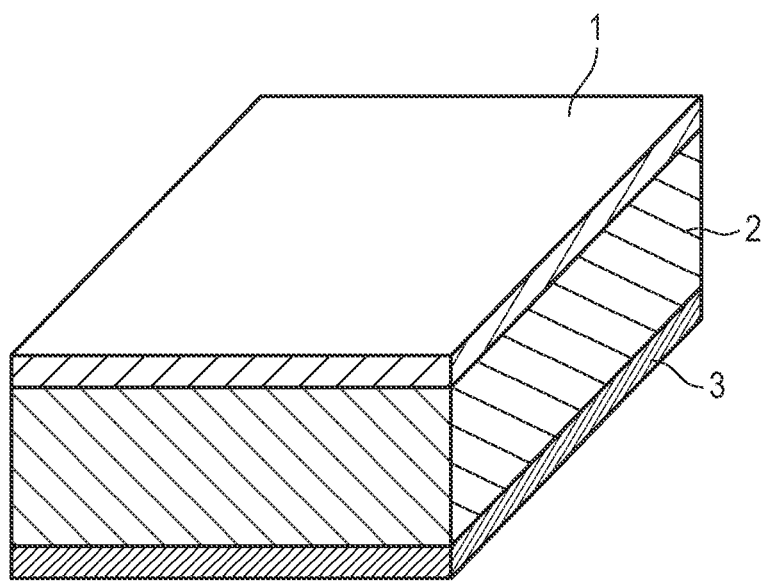
FIG. 1 is a schematic diagram illustrating an embodiment of the configuration of a piezoelectric element according to the present invention.

Embodiments of the present invention will be described below. The description will be given by taking an orthorhombic phase and a tetragonal phase as an example of ferroelectric phases A and B. However, the present invention is not limited to these.

A piezoelectric material according to the present invention is a ferroelectric piezoelectric material that exhibits a phase transition according to a temperature change.

The piezoelectric material according to the present invention has a low-temperature side ferroelectric phase A and a high-temperature side ferroelectric phase B between which the phase of the piezoelectric material transitions according to a temperature change.

The content of Pb and K in the piezoelectric material is preferably less than 1000 ppm since in this way the load on the environment is small.

For example, the piezoelectric material is a perovskite-type metal oxide containing Ba and Ti. The piezoelectric material further contains Zr. The molar ratio of Zr to the sum of Ti and Zr may be $0.02 \leq x \leq 0.13$, and the molar ratio of Ba to the sum of Ti and Zr may be $0.986 \leq a \leq 1.02$.

Specifically, the piezoelectric material can be one having a main component containing a perovskite-type metal oxide represented by the following general formula (1) and Mn.

$$Ba_a(Ti_{1-x}Zr_x)O_3 \quad (1),$$

where $0.02 \leq x \leq 0.13$ and $0.986 \leq a \leq 1.02$.

(Perovskite-Type Metal Oxide)

In the present invention, a perovskite-type metal oxide refers to a metal oxide having a perovskite structure which is ideally a cubic structure as described in Iwanami Dictionary of Physics and Chemistry, 5th edition (published by Iwanami Shoten in Feb. 20, 1998). Generally, a metal oxide having a perovskite structure is expressed by a chemical formula $ABO_3$. In a perovskite-type metal oxide, A and B elements occupy specific positions in the unit cell called A sites and B site in the form of ions, respectively. For example, in the unit cell of a cubic system, the A element is located at the vertices of the cube, and the B element is located at the body center. The O element occupies the face-centered positions of the cube as anions of oxygen.

The metal oxide represented by the general formula (1) means that the metallic element located at the A sites is Ba, and the metallic elements located at the B sites are Ti and Zr. Here, B may be located at some B sites. Likewise, Ti and Zr may be located at some A sites.

In the general formula (1), the molar ratio of the B-site elements and the O element is 1:3. However, even if the element quantity ratio slightly varies, the metal oxide is included in the scope of the present invention as long as it has a perovskite structure as its main phase.

Whether the metal oxide is a perovskite structure can be determined via a structural analysis with X-ray diffraction or electron diffraction, for example. If the main phase of the metal oxide is a perovskite structure, a large part of the structural analysis result will be analysis data originating from this perovskite structure.

(Main Component of Piezoelectric Material)

For the piezoelectric material according to the present invention, a in the general formula (1), which indicates the ratio of the molar quantity of Ba at the A sites to the molar quantity of Ti and Zr at the B sites, is not particularly limited. However, being within a range of $0.9860 \leq a \leq 1.0200$ is preferred in that the mechanical strength is sufficient and the sinterability is good.

The piezoelectric material preferably contains 90 mol % or more of the perovskite-type metal oxide represented by the general formula (1) as the main component, and more preferably contains 95 mol % or more of the perovskite-type metal oxide.

If a is less than 0.9860, crystal grains forming the piezoelectric material will be prone to abnormal grain growth, which leads to a fear of lowering the mechanical strength of the material. If, on the other hand, a is more than 1.0200, the temperature necessary for the grain growth will be excessively high, which leads to a fear of being unable to sinter the piezoelectric material in a common calcination furnace. Here, "being unable to sinter" refers to a state where the density does not reach a sufficient value or many pores and defects are present in the piezoelectric material.

In the general formula (1), x, indicating the molar ratio of Zr at the B sites, is preferably within a range of $0.02 \leq x \leq 0.13$ since in this way the Curie temperature is higher than the driving temperature range and the piezoelectric material has sufficient piezoelectric properties. If x is more than 0.13, the Curie temperature will be excessively low, which leads to a fear of insufficient high-temperature durability. If x is less than 0.02, there will be a fear of being unable to achieve sufficient piezoelectric properties in the device driving temperature range (e.g., 0° C. to 60° C.).

Note that the Curie temperature ($T_c$) refers herein to a temperature at and above which a material loses its ferroelectricity. Generally, piezoelectric materials also lose their piezoelectric properties at $T_c$ or above. Methods of measuring $T_c$ include a method involving directly measuring the temperature at which the ferroelectricity is lost while changing the measurement temperature, and a method involving measuring the relative permittivity by using a minute alternating electric field while changing the measurement temperature and figuring out $T_c$ from the temperature at which the relative permittivity indicates a maximum.

The means for measuring the composition of the piezoelectric material according to the present invention is not particularly limited. The means includes X-ray fluorimetry, ICP emission spectrometry, atomic absorption spectroscopy, and the like. The weight ratio and compositional ratio (molar ratio) of each element contained in the piezoelectric material can be calculated by any of these means.

(Sub-Components of Piezoelectric Material)

The piezoelectric material may contain Mn as a first sub-component. The content of the Mn is 0.0020 mole or more and 0.0150 mole or less per mole of the perovskite-type metal oxide.

Here, as for the content of the sub-component, the content of each metal in the piezoelectric material measured by X-ray fluorimetry (XRF), ICP emission spectrometry, atomic absorption spectroscopy, or the like is calculated first. Then, from the content of each metal, the elements forming the metal oxide represented by the general formula (1) are converted into moles, and the content of the sub-component is represented as the ratio of its moles to the total moles being 1.

When the piezoelectric material according to the present invention contains Mn within the above range, its mechanical quality factor in a room temperature range improves. Here, the mechanical quality factor refers to a factor indicating an elastic loss by vibration of the piezoelectric material evaluated as a vibrator. The magnitude of the mechanical quality factor is observed as the sharpness of a resonance curve in impedance measurement. That is, the mechanical quality factor is a constant indicating the sharpness of the resonance of the vibrator. The larger the mechanical quality factor, the smaller the energy loss by vibration. By improving the insulating properties and the mechanical quality factor, the reliability of the piezoelectric material as a piezoelectric element when voltage is applied to the piezoelectric element to drive it is ensured over a long period of time.

If the content of Mn per mole of the metal oxide is less than 0.0020 mole, the mechanical quality factor in the room temperature range will be as small as less than 150. If the mechanical quality factor is small, it will increase the power consumed when a piezoelectric element including the piezoelectric material and a pair of electrodes is driven as a resonating device. The mechanical quality factor is preferably 200 or more and more preferably 400 or more. The mechanical quality factor is further preferably 700 or more. Within this range, the power consumption does not increase when the device is driven. On the other hand, if the content of Mn is more than 0.0150 mole, the insulating properties of the piezoelectric material will decrease. For example, the dissipation factor of the piezoelectric material at a frequency of 1 kHz exceeds 0.006, or the resistivity falls below 1 GΩcm. The dissipation factor can be measured using an impedance analyzer. A dissipation factor of 0.006 or less enables stable operation even when high voltage is applied to the piezoelectric material used as an element. A resistivity of 1 GΩcm suffices for the piezoelectric material to be polarized and driven as a piezoelectric element. The resistivity is more preferably 50 GΩcm or more.

Mn is not limited to the metal Mn and may be contained in any form as long as it is contained in the piezoelectric material as a Mn component. For example, Mn may be dissolved at B sites or contained at grain boundaries. Alternatively, a Mn component may be contained in the piezoelectric material in the form of a metal, ion, oxide, metallic salt, complex, or the like. It is preferred that Mn is present in view of the insulating properties and ease of sintering. This is because Mn can generally take valences of 4+, 2+, and 3+ and, when conduction electrons are present in the crystal (such as when oxygen defects are present in the crystal or when a donor element occupies A sites, for example), a decrease in the valence of Mn from 4+ to 3+ or 2+, for example, enables the Mn to trap conduction electrons, which can improve the insulation resistance.

On the other hand, when the valence of Mn is smaller than 4+ (such as 2+), the Mn serves as an acceptor. When Mn is present as an acceptor in the perovskite structure crystal, a hole is generated in the crystal or an oxygen vacancy is formed in the crystal.

If a large proportion of the added Mn have a valence of 2+ or 3+, the holes cannot be compensated for only by introducing oxygen vacancies, so that the insulation resistance decreases. It is therefore preferred that a major proportion of the Mn be 4+. Also, a very small proportion of the Mn may have a valence smaller than 4+ and serve as acceptors to occupy B sites in the perovskite structure and form oxygen vacancies. This is because Mn with a valence of 2+ or 3+ and oxygen vacancies can form defect dipoles and improve the mechanical quality factor of the piezoelectric material. If trivalent Bi occupies A sites, Mn tends to take a valence smaller than 4+ in order to balance the charge.

The valence of Mn added in a minute quantity in a non-magnetic (diamagnetic) material can be evaluated by measurement of the temperature dependence of the magnetic susceptibility. The magnetic susceptibility can be measured with a superconducting quantum interference device (SQUID), a vibrating sample magnetometer (VSM), or a magnetic balance. A magnetic susceptibility x obtained by the measurement follows the Curie-Weiss law, which is generally represented by an equation 2.

$$\chi = C/(T-\theta) \text{ } (C: \text{Curie constant, } \theta: \text{paramagnetic Curie temperature}) \quad \text{(Equation 2)}$$

Generally, Mn added in a minute quantity in a non-magnetic material exhibits a spin S=5/2 when the valence is 2+, S=2 when the valence is 3+, and S=3/2 when the valence is 4+. Thus, the Curie constant C per unit quantity of Mn is a value corresponding to the value of the spin S with each valence of Mn. Hence, by deriving the Curie constant C from the temperature dependence of the magnetic susceptibility x, it is possible to evaluate an average valence of Mn in a sample.

To evaluate the Curie constant C, the temperature dependence of the magnetic susceptibility is desirably measured from as low a temperature as possible. This is because the quantity of Mn is minute and therefore at a relatively high temperature such as around room temperature, the value of the magnetic susceptibility is also extremely small, which makes the measurement difficult. The Curie constant C can be derived from the gradient of a straight line obtained by plotting a reciprocal 1/χ of the magnetic susceptibility with respect to the temperature T and linearly approximating the plotted result.

(Piezoelectric Element)

FIG. 1 is a schematic diagram illustrating an embodiment of the configuration of a piezoelectric element according to the present invention having electrodes and a piezoelectric material. The present invention represents a method of manufacturing a piezoelectric element having at least a pair of electrodes (first electrode 1 and second electrode 3) and a piezoelectric material 2. Specifically, it is a method of manufacturing a piezoelectric element characterized in that it has steps of: raising the temperature of a piezoelectric material from room temperature to a temperature range higher than $T_{(B \to A)}$ and lower than $T_{(A \to B)}$; starting application of a voltage to the piezoelectric material in a state where it is held within this temperature range; and then continuing and finishing the application of the voltage at a temperature lower than $T_{(A \to B)}$ (details of these steps will be described later as a polarization treatment).

The piezoelectric element according to the present invention is a piezoelectric element having at least a first electrode and a second electrode, and the piezoelectric properties can be evaluated from its shape. The first electrode and the second electrode are each formed of a conductive layer with a thickness of about 5 nm to 10 μm. Their material is not particularly limited, and only needs to be a material generally used for piezoelectric elements. Examples include metals such as Ti, Pt, Ta, Ir, Sr, In, Sn, Au, Al, Fe, Cr, Ni, Pd, Ag, and Cu, alloys thereof, and compounds thereof.

The first electrode and the second electrode may each be made of one of them or a laminate made of two or more of them. Also, the first electrode and the second electrode may be of different materials.

The method of manufacturing the first electrode and the second electrode is not limited. They may be formed by baking of metallic paste or formed by sputtering, vapor deposition, or the like. Also, the first electrode and the second electrode may each be patterned into a desired shape and used.

(Measurement of Phase Transition Temperatures)

The phase transition temperatures can be figured out by measuring the capacitance of a sample with an impedance analyzer (4194A (product name) manufactured by Agilent Technologies, Inc.) while changing the temperature of the sample. At the same time, the temperature dependence of the dissipation factor can also be figured out via measurement with the impedance analyzer. $T_C$ is the temperature at which the permittivity reaches a maximum around the phase transition temperature between the ferroelectric phase (tetragonal phase) and the paraelectric phase (cubic phase), and is defined as the temperature at which the value of the permittivity reaches a maximum in a process of measuring the permittivity while heating the sample.

The temperature at which a change from the ferroelectric phase B to the ferroelectric phase A occurs in a temperature lowering process will be denoted as $T_{(B \to A)}$. The temperature at which a change from the ferroelectric phase A to the ferroelectric phase B occurs in a temperature rising process will be denoted as $T_{(A \to B)}$.

In the invention of the present application, critical temperatures such as $T_{(B \to A)}$ and $T_{(A \to B)}$ are important. The critical temperature of the piezoelectric material in a temperature rising process in which its sample is heated, and the critical temperature of the piezoelectric material in a temperature lowering process in which the sample is cooled are different.

For instance, $T_{(B \to A)}$ can be denoted as $T_{(t \to o)}$, and examples of $T_{(t \to o)}$ include $T_{to}$. $T_{to}$ is the temperature at which the crystal system changes from tetragonal to orthorhombic. To measure $T_{to}$, for example, the temperature of the sample is raised to 150° C. or above, and then the permittivity is measured while the sample is cooled. Then, the temperature at which a value obtained by a second-order differentiation of the obtained permittivity with respect to the sample temperature is 0 is estimated, and this temperature is defined as $T_{to}$. That is, $T_{to}$ is a point corresponding to an inflection point in the profile of change in permittivity with temperature in a temperature lowering process.

Also, $T_{(A \to B)}$ can be denoted as $T_{(o \to t)}$, and examples of $T_{(o \to t)}$ include $T_{ot}$. $T_{ot}$ is the temperature at which the crystal system changes from orthorhombic to tetragonal.

To measure $T_{ot}$, for example, the temperature of the sample is lowered from room temperature to −100° C. or below, and then the permittivity is measured while the sample is heated.

Then, the temperature at which a value obtained by a second-order differentiation of the obtained permittivity with respect to the sample temperature is 0 is estimated, and this temperature is defined as $T_{ot}$. That is, $T_{ot}$ is a point corresponding to an inflection point in the profile of change in permittivity with temperature in a temperature rising process.

Figure 3A:
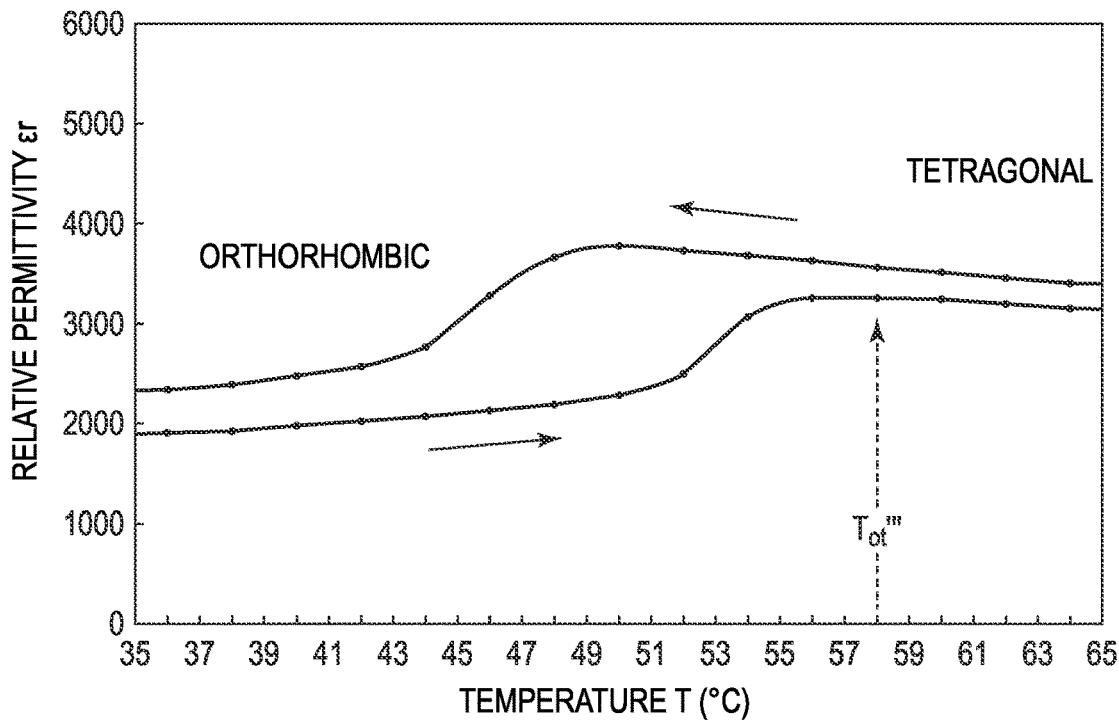
FIG. 3A is a diagram obtained by enlarging a part of FIG. 2A around the orthorhombic-tetragonal transition temperatures.
Figure 3B:
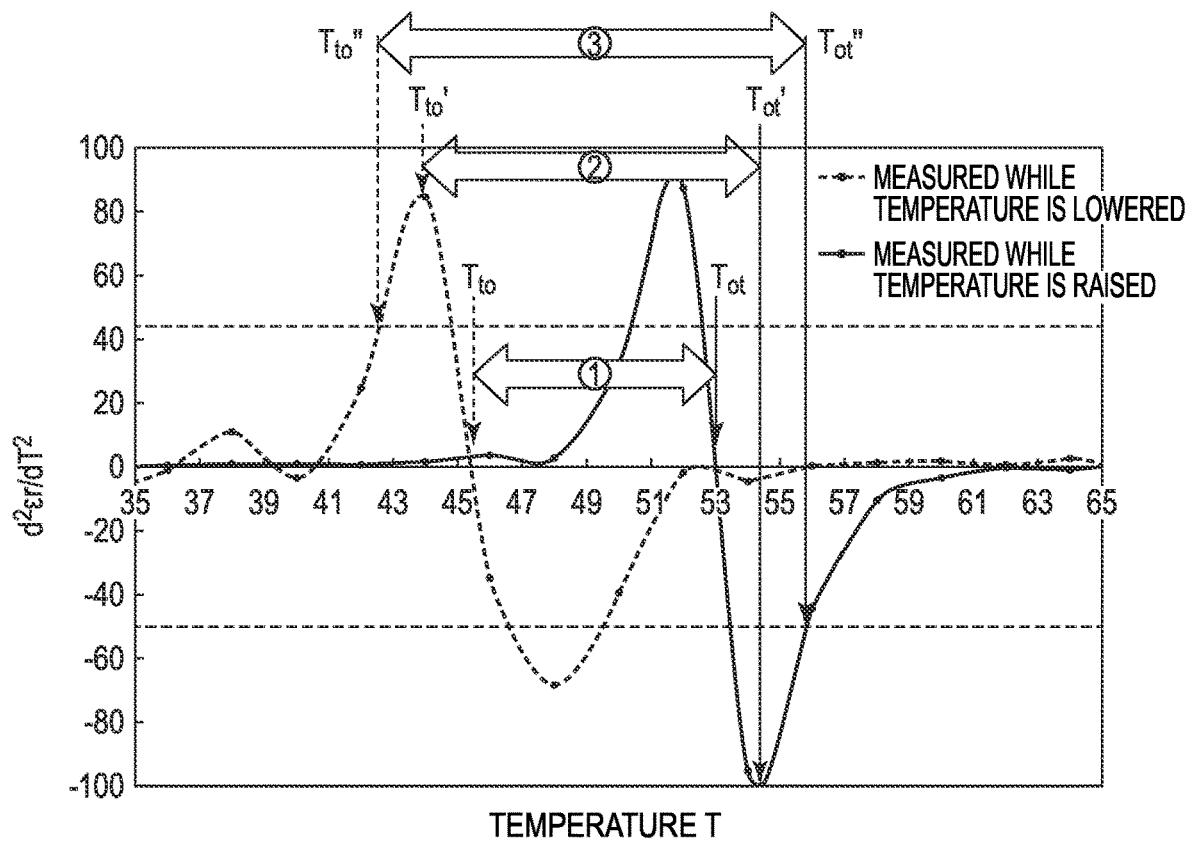
FIG. 3B is a diagram illustrating a second-order differentiation of the curves of changes in permittivity with respect to temperature illustrated in FIG. 3A with respect to temperature.

FIG. 3B is a diagram illustrating the second-order differentiation of the profiles of changes in permittivity with respect to temperature.

Further, the critical temperatures such as $T_{(t \to o)}$ and $T_{(o \to t)}$ can be figured out by another method.

The temperature of the sample is raised to 150° C. or above, and the permittivity is measured while the sample is cooled. Then, the temperature at which a value obtained by a second-order differentiation of the obtained permittivity with respect to the sample temperature takes a maximum value is defined as $T_{to}'$, and the temperature on the low-temperature side at which the value of the second-order derivative is a half of the maximum value is defined as $T_{to}''$. One of these temperatures $T_{to}$, $T_{to}'$, and $T_{to}''$ may be employed as the temperature $T_{(t \to o)}$, at which a change from the ferroelectric phase B to the ferroelectric phase A occurs in a temperature lowering process.

Similarly, the temperature of the sample is cooled from room temperature to −100° C. or below, and then the permittivity is measured while the sample is heated. Then, the temperature at which a value obtained by a second-order differentiation of the obtained permittivity with respect to the sample temperature takes a minimum value is defined as $T_{ot}'$, and the temperature on the high-temperature side at which the value of the second-order derivative is a half of the minimum value is defined as $T_{ot}''$. One of these temperatures $T_{ot}$, $T_{ot}'$, and $T_{ot}''$ may be employed as the temperature $T_{(o \to t)}$, at which a change from the ferroelectric phase A to the ferroelectric phase B occurs in a temperature rising process.

Further, the temperature which is next to and lower than $T_C$ and at which the permittivity takes a maximum is defined as $T_{ot}'''$. This temperature $T_{ot}'''$ may likewise be employed as a critical temperature.

For other ferroelectric phase transitions such as those between an orthorhombic phase and a rhombohedral phase, too, $T_{AB}$, $T_{BA}$, $T_{AB}'$, $T_{BA}'$, $T_{AB}''$ and $T_{BA}''$ are defined in a similar manner, and the temperature at which the permittivity takes a maximum around the phase transition temperature for the ferroelectric phases A and B is defined as $T_{BA}'''$.

(Polarization Treatment)

A method of manufacturing the piezoelectric material according to the invention of the present application has the following steps.

First of all, the piezoelectric material has the low-temperature side ferroelectric phase A and the high-temperature side ferroelectric phase B between which the phase of the piezoelectric material transitions according to a temperature change. Note that the temperature at which a change from the ferroelectric phase B to the ferroelectric phase A occurs in a temperature lowering process is defined as $T_{(B \to A)}$, and the temperature at which a change from the ferroelectric phase A to the ferroelectric phase B occurs in a temperature rising process is defined as $T_{(A \to B)}$.

The temperature of this piezoelectric material is raised from a low-temperature side to a temperature range higher than $T_{(B \to A)}$ and lower than $T_{(A \to B)}$, and application of an electric field to the piezoelectric material is started in a state where the piezoelectric material is held within this temperature range. The application of the electric field is then continued and finished at a temperature lower than $T_{(A \to B)}$.

It is even better if the starting point on the low-temperature side is room temperature.

A specific polarization treatment is carried out through steps of: raising the temperature of a sample to a temperature higher than $T_{(t \to o)}$ and lower than $T_{(o \to t)}$; applying an electric field for a desired time (e.g., 30 minutes) at this temperature; then lowering the temperature of the sample to a temperature lower than $T_{to}$ while keeping the application of the electric field; and thereafter removing the electric field.

The polarization treatment may be performed in the atmosphere or in silicone oil. The temperature at which to start the polarization is preferably a temperature at which the piezoelectric material contains an orthorhombic crystal, and the polarization is preferably started at a temperature higher than or equal to $T_{to}''$, $T_{to}'$, or $T_{to}$ as $T_{(t \to o)}$. Note that this polarization starting temperature is a temperature lower than or equal to $T_{(o \to t)}$, that is, lower than or equal to $T_{ot}'''$, $T_{ot}''$, $T_{ot}'$, or $T_{ot}$.

The temperature at which to apply an electric field to start the polarization is preferably a temperature higher than $T_{to}''$ and lower than $T_{ot}'''$. The temperature is more preferably higher than $T_{to}''$ and lower than $T_{ot}''$. The temperature is even more preferably higher than $T_{to}'$ and lower than $T_{ot}'$. The temperature is still more preferably higher than $T_{to}$ and lower than $T_{ot}$.

Figure 4:
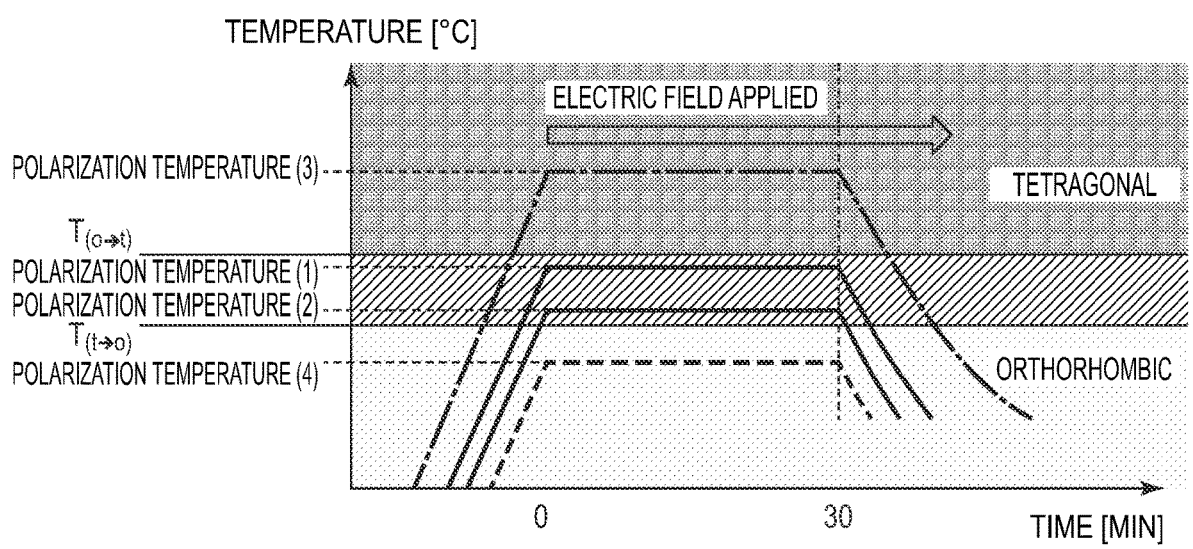
FIG. 4 is a schematic diagram explaining a polarization treatment for fabricating the piezoelectric element according to the present invention.

The electric field to be applied to perform the polarization treatment is preferably 0.8 kV/mm to 2 kV/mm. FIG. 4 schematically illustrates the process of the polarization treatment for fabricating the piezoelectric element according to the present invention. The horizontal axis represents time while the vertical axis represents the temperature of the piezoelectric element. In the case of using an oil bath, the temperature of the oil may be used as a representative value.

The polarization treatment in the element fabrication is characterized in that it includes a step of applying an electric field at a temperature higher than $T_{to}$ and lower than $T_{ot}$ like a polarization temperature (1) or a polarization temperature (2) (alternatively, critical temperatures mentioned above may be employed such that the temperature is higher than $T_{to}''$ and lower than $T_{ot}'''$, for example).

In the case of performing the polarization treatment on a tetragonal crystal, polarization is firstly formed in one of the <100> directions, which correspond to stable polarization arrangements in the tetragonal crystal. When the temperature of the sample is then lowered to change it to an orthorhombic crystal, there can be a possibility that the polarization is separated and re-oriented in one of the four equivalent <110> directions close to the polarization direction (such, for example, as the following four directions in the orthorhombic crystal in the case where the polarization direction in the tetragonal crystal is [001]).

[101], [$\bar{1}$01], [011], [0$\bar{1}$1]

By initially performing the polarization treatment in the state of containing an orthorhombic crystal, polarization parallel to one of the <110> directions can be preferentially formed. This is considered to lead to an improvement in the electromechanical coupling coefficient in the orthorhombic crystal.

(Measurement of Piezoelectric Properties)

To measure the piezoelectric properties of the piezoelectric element, the result of measurement of the resonance frequency and the antiresonance frequency is obtained using a commercially available impedance analyzer (4194A (product name) manufactured by Agilent Technologies, Inc.). The measurement result can then be used to figure out the piezoelectric properties such as the piezoelectric constant and the electromechanical coupling coefficient by calculation based on a standard by the Japan Electronics and Information Technology Industries Association (JEITA EM-4501A). Hereinafter, this method will be referred to as the resonance-antiresonance method.

(Electromechanical Coupling Coefficient)

The electromechanical coupling coefficient is a coefficient indicating the efficiency of conversion between electrical energy and mechanical energy. It is represented as the square root of the ratio of "mechanical energy to be outputted" and "inputted electrical energy" or as the square root of the ratio of "electrical energy to be outputted" and "inputted mechanical energy". The same piezoelectric body exhibits different values depending on the vibration mode. For example, in the case of longitudinal vibration of a cylindrical vibrator formed of a longitudinally polarized piezoelectric body, an electromechanical coupling coefficient $k_{33}$ can be figured out from the following equation by using a resonance frequency fr and an antiresonance frequency fa.

$$k_{33}^2 = \frac{\pi}{2} \cdot \frac{f_r}{f_a} \cot\left(\frac{\pi}{2} \cdot \frac{f_r}{f_a}\right)$$

Also, in the case of stretching vibration in the long-side direction of a plate-shaped vibrator polarized in the plate thickness direction, an electromechanical coupling coefficient $k_{31}$ can be figured out from the following equation by using the resonance frequency fr and the antiresonance frequency fa.

$$\frac{k_{31}^2}{1-k_{31}^2} = -\frac{\pi}{2} \cdot \frac{f_r}{f_a} \cot\left(\frac{\pi}{2} \cdot \frac{f_a}{f_r}\right)$$

With the above equations, the electromechanical coupling coefficients are obtained in a decimal representation. However, they are often represented in % as well. In the following, the % representation will be used.

According to the present invention, it is possible to obtain a piezoelectric element having a large electromechanical coupling coefficient in a range of 0° C. to 60° C., for example.

The piezoelectric element according to the present invention can be used, for example, in ultrasonic vibrators including ultrasonic probes, ultrasonic cleaners, and the like, piezoelectric buzzers, ceramic filters, and so on.

(Electronic Device)

An electronic device according to the present invention will be described. The electronic device according to the present invention is characterized in that it includes the above piezoelectric element. The electronic device includes ultrasonic vibrators, piezoelectric buzzers, ceramic filters, and so on.

EXAMPLES

In the following, the present invention will be more specifically described through Examples, but the present invention is not limited to Examples below.

Piezoelectric elements according to the present invention were obtained through the following procedure.

(Processing)

For the electrodes of each piezoelectric element according to the present invention, a disc-shaped piece of a piezoelectric ceramic was processed by grinding to a desired thickness, and a 400 nm-thick gold electrode was formed on both the front and back surfaces by DC sputtering. Note that a 30 nm-thick titanium film was formed as an adhesion layer between each electrode and the ceramic. This ceramic with the electrodes was cut to fabricate a columnar piezoelectric element measuring 0.7 mm×0.8 mm×5 mm.

(Polarization Treatment and Evaluation)

The piezoelectric element was polarized through the following procedure to obtain the piezoelectric element according to the present invention.

The relationships among $T_{(o \to t)}$, $T_{(t \to o)}$, and the electric field application temperatures in Examples and Comparative Examples are as shown in Table 1.

In the following, for example, a piezoelectric material containing a metal oxide $Ba(Ti_{0.95}Zr_{0.05})O_3$ and 0.0030 mole of Mn per mole of this metal oxide will be denoted as $Ba(Ti_{0.95}Zr_{0.05})O_3Mn_{0.003}$ for simplicity.

Examples 1-1 and 1-2

Figure 2A:
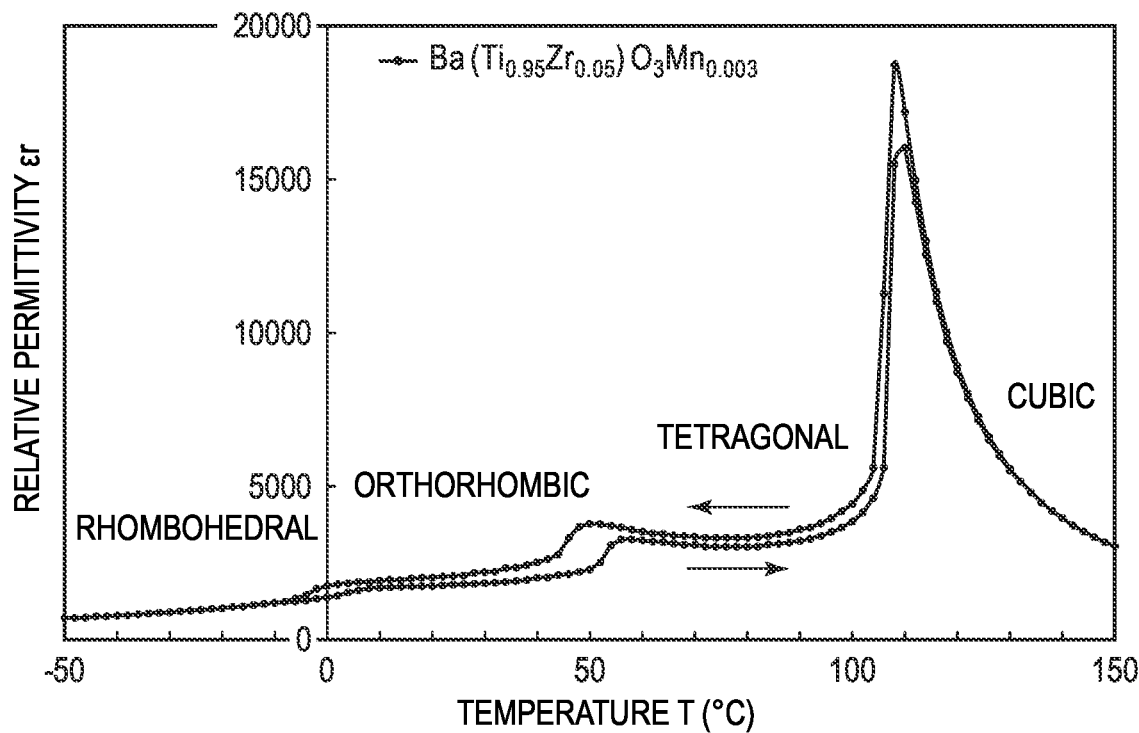
FIG. 2A is a diagram illustrating changes in permittivity of a material used in Examples and Comparative Examples of the present invention with temperature.

Piezoelectric elements measuring 0.7 mm×0.8 mm×5 mm were fabricated using a piezoelectric material $Ba(Ti_{0.95}Zr_{0.05})O_3Mn_{0.003}$. The shape of each piezoelectric element was columnar. This piezoelectric material exhibits a temperature characteristic of permittivity as illustrated in FIG. 2A. The profile depicted alongside the right-pointing arrow represents the change in relative permittivity with temperature measured in a process of raising the temperature of the piezoelectric material from a low-temperature side, whereas the profile depicted alongside the left-pointing arrow represents the reverse.

In the polarization treatment, the temperature of the piezoelectric element was raised from room temperature to 55° C., an electric field of 1.0 kV/mm was applied to the piezoelectric element in the longitudinal direction for 30 minutes in a state where it was held at 55° C., then the temperature was lowered to 35° C. (Example 1-1) or 40° C. (Example 1-2), and thereafter the electric field was removed. The polarization treatment in these Examples corresponds to the polarization treatment process that follows the polarization temperature (1) among the plurality of schematic polarization treatment processes illustrated in FIG. 4 mentioned above.

Figure 5A:
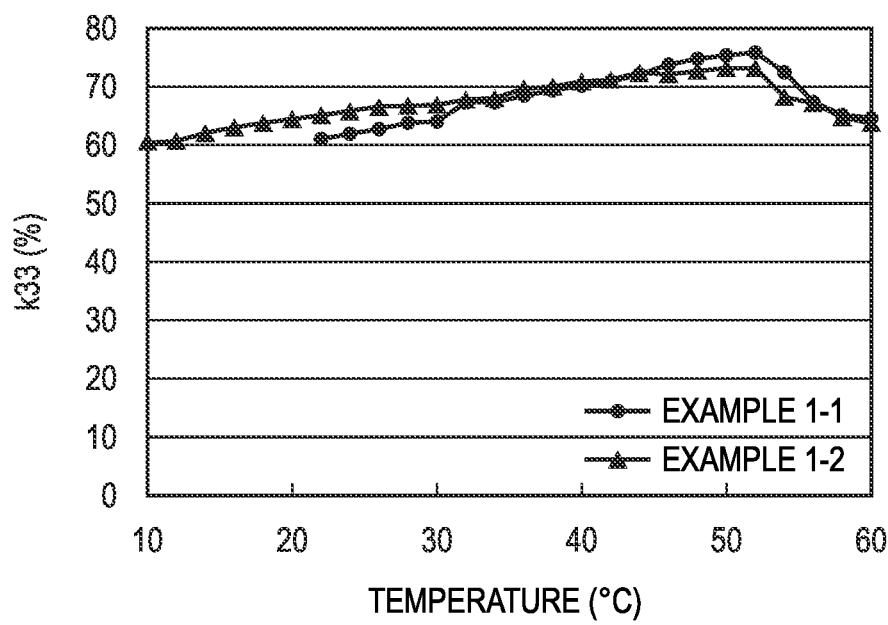
FIG. 5A is a diagram illustrating changes in a $k_{33}$ value of piezoelectric elements fabricated in Examples 1-1 and 1-2 of the present invention with temperature.
Figure 5B:
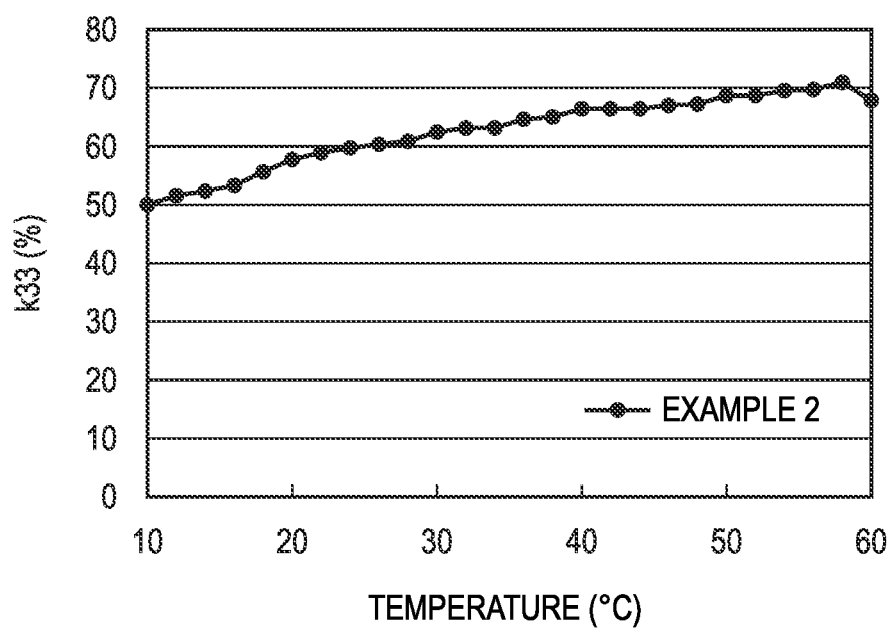
FIG. 5B is a diagram illustrating changes in the $k_{33}$ value of a piezoelectric element fabricated in Example 2 of the present invention with temperature.

Each piezoelectric element was obtained in this manner. FIGS. 5A and 5B are diagrams illustrating the changes in the $k_{33}$ value of the piezoelectric elements in Examples of the present invention with temperature. As illustrated in FIG. 5A, piezoelectric elements exhibiting $k_{33}$ values of 70% or more in temperature ranges of 42° C. to 54° C. and 42° C. to 52° C. were obtained in Examples 1-1 and 1-2, respectively.

Example 2

A piezoelectric element measuring 0.7 mm×0.8 mm×5 mm was fabricated using a piezoelectric material $Ba(Ti_{0.94}Zr_{0.06})O_3Mn_{0.003}$. The shape of the piezoelectric element was columnar. This piezoelectric material has a larger Zr content than the piezoelectric material in Examples 1-1 and 1-2, and exhibits a temperature characteristic of permittivity as depicted in FIG. 2B.

In the polarization treatment, the temperature of the piezoelectric element was raised from room temperature to 55° C., an electric field of 1.8 kV/mm was applied to the piezoelectric element in the longitudinal direction for 30 minutes in a state where it was held at 55° C., then the temperature was lowered to 35° C., and thereafter the electric field was removed. As illustrated in FIG. 5B, a piezoelectric element exhibiting a $k_{33}$ value of 70% or more at 58° C. was obtained.

Comparative Example 1

Figure 2B:
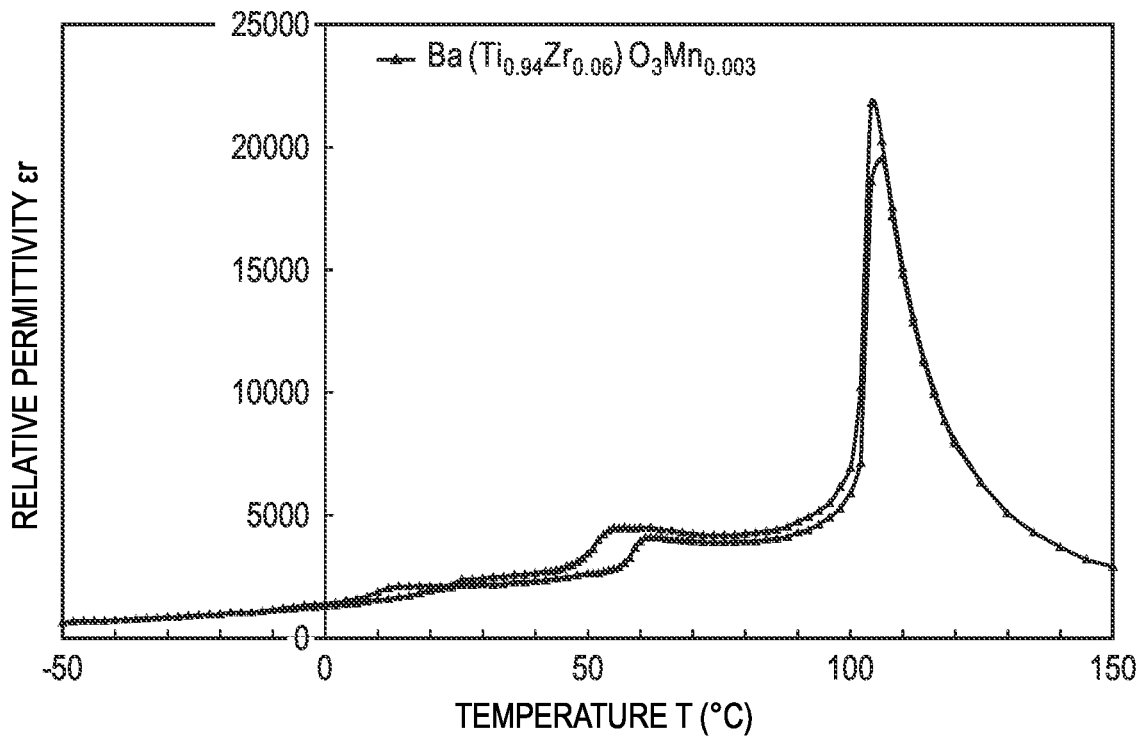
FIG. 2B is a diagram illustrating changes in permittivity of a material used in Example and Comparative Examples of the present invention with temperature.

A piezoelectric element measuring 0.7 mm×0.8 mm×5 mm was fabricated using the piezoelectric material $Ba(Ti_{0.94}Zr_{0.06})O_3Mn_{0.003}$ (the temperature characteristic of permittivity in FIG. 2B). The shape of the piezoelectric element was columnar. In the polarization treatment, unlike the above Examples, the temperature of the piezoelectric element was raised from room temperature to 100° C., an electric field of 1.8 kV/mm was applied to the piezoelectric element in the longitudinal direction for 30 minutes in a state where it was held at 100° C., then the temperature was lowered to 45° C., and thereafter the electric field was removed.

The polarization treatment in this Comparative Example corresponds to the process that follows a polarization temperature (3) illustrated in FIG. 4 mentioned above. The piezoelectric element was obtained in this manner.

Figure 6:
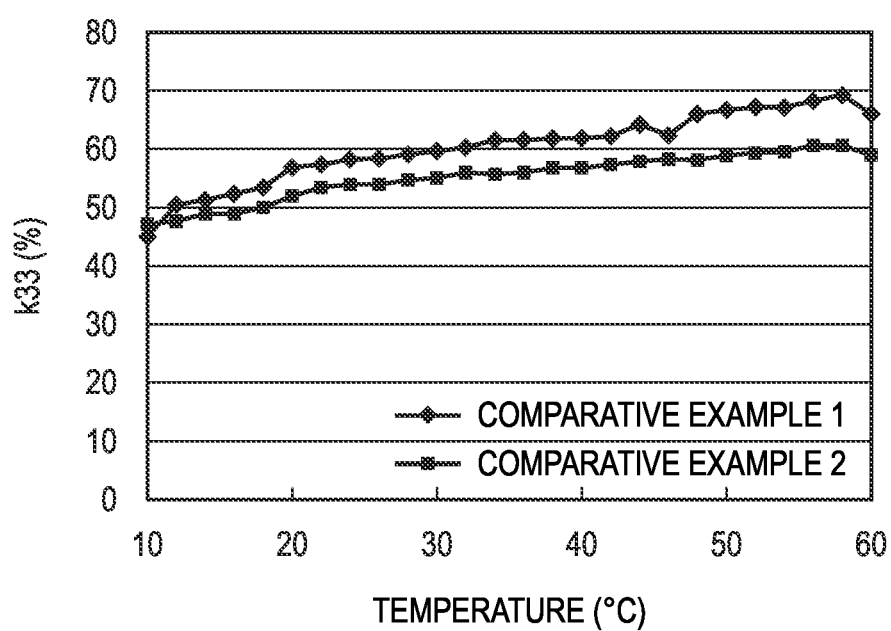
FIG. 6 is a diagram illustrating changes in the $k_{33}$ value of piezoelectric elements fabricated in Comparative Examples 1 and 2 of the present invention with temperature.

The result of measurement of the $k_{33}$ value is illustrated in FIG. 6. The $k_{33}$ value was less than 70% in a temperature range of 0° C. to 60° C.

Comparative Example 2

A piezoelectric element measuring 0.7 mm×0.8 mm×5 mm was fabricated using the piezoelectric material $Ba(Ti_{0.94}Zr_{0.06})O_3Mn_{0.003}$ (the temperature characteristic of permittivity in FIG. 2B). The shape of the piezoelectric element was columnar. In the polarization treatment, unlike the above Examples, the temperature of the piezoelectric element was raised from room temperature to 45° C., an electric field of 1.0 kV/mm was applied to the piezoelectric element in the longitudinal direction for 30 minutes in a state where it was held at 45° C., then the temperature was lowered to 35° C., and thereafter the electric field was removed. The polarization treatment in this Comparative Example corresponds to the process that follows a polarization temperature (4) illustrated in FIG. 4 mentioned above. The piezoelectric element was obtained in this manner.

The result of measurement of the $k_{33}$ value is illustrated in FIG. 6. The $k_{33}$ value was less than 70% in a temperature range of 0° C. to 60° C.

Example 3-1

A piezoelectric element measuring 0.7 mm×0.8 mm×5 mm was fabricated using the piezoelectric material $Ba(Ti_{0.95}Zr_{0.05})O_3Mn_{0.003}$. The shape of the piezoelectric element was columnar. $T_{to}$, $T_{to}'$, $T_{to}''$, $T_{ot}$, $T_{ot}'$, and $T_{ot}''$ were 46° C., 44° C., 43° C., 53° C., 54° C., and 56° C., respectively. The polarization treatment was performed by a method in which the temperature of the piezoelectric element was raised from room temperature to 55° C., an electric field of 1.8 kV/mm was applied to the piezoelectric element in the longitudinal direction for 30 minutes in a state where it was held at 55° C., then the temperature was lowered to 35° C., and thereafter the electric field was removed. $k_{33}$ was measured one month after the polarization treatment. A piezoelectric element exhibiting a $k_{33}$ value of 70% or more at 52° C. was obtained. Also, the $k_{33}$ value at 36° C. was 66%.

Example 3-2

A piezoelectric element measuring 0.7 mm×0.8 mm×5 mm was fabricated using the piezoelectric material $Ba(Ti_{0.95}Zr_{0.05})O_3Mn_{0.003}$. The shape of the piezoelectric element was columnar. $T_{to}$, $T_{to}'$, $T_{to}''$, $T_{ot}$, $T_{ot}'$, and $T_{ot}''$ were 46° C., 44° C., 43° C., 53° C., 54° C., and 56° C., respectively. The polarization treatment was performed by a method in which the temperature of the piezoelectric element was raised from room temperature to 45° C., an electric field of 1.8 kV/mm was applied to the piezoelectric element in the longitudinal direction for 30 minutes in a state where it was held at 45° C., then the temperature was lowered to 35° C., and thereafter the electric field was removed. $k_{33}$ was measured one month after the polarization treatment. The $k_{33}$ value was less than 70% in a temperature range of 0° C. to 60° C. Also, the $k_{33}$ value at 36° C. was 57%.

Comparative Example 3

A piezoelectric element measuring 0.7 mm×0.8 mm×5 mm was fabricated using the piezoelectric material $Ba(Ti_{0.95}Zr_{0.05})O_3Mn_{0.003}$. The shape of the piezoelectric element was columnar. $T_{to}$, $T_{to}'$, $T_{to}''$, $T_{ot}$, $T_{ot}'$, and $T_{ot}''$ were 46° C., 44° C., 43° C., 53° C., 54° C., and 56° C., respectively. The polarization treatment was performed by a method in which the temperature of the piezoelectric element was raised from room temperature to 60° C., an electric field of 1.8 kV/mm was applied to the piezoelectric element in the longitudinal direction for 30 minutes in a state where it was held at 60° C., then the temperature was lowered to 35° C., and thereafter the electric field was removed. $k_{33}$ was measured one month after the polarization treatment. The $k_{33}$ value was less than 70% in a temperature range of 0° C. to 60° C. Also, the $k_{33}$ value at 36° C. was 53%.

Example 4-1

A piezoelectric element measuring 0.7 mm×0.8 mm×5 mm was fabricated using the piezoelectric material $Ba(Ti_{0.95}Zr_{0.05})O_3Mn_{0.003}$. The shape of the piezoelectric element was columnar. $T_{to}$, $T_{to}'$, $T_{to}''$, $T_{ot}$, $T_{ot}'$, and $T_{ot}''$ were 46° C., 44° C., 43° C., 53° C., 54° C., and 56° C., respectively. The polarization treatment was performed by a method in which the temperature of the piezoelectric element was raised from room temperature to 55° C., an electric field of 1.8 kV/mm was applied to the piezoelectric element in the longitudinal direction for 30 minutes in a state where it was held at 55° C., then the temperature was lowered to 35° C., and thereafter the electric field was removed. $k_{33}$ was measured one month after the polarization treatment. A piezoelectric element exhibiting a $k_{33}$ value of 70% or more at 52° C. was obtained. Also, the $k_{33}$ value at 40° C. was 67%.

Example 4-2

A piezoelectric element measuring 0.7 mm×0.8 mm×5 mm was fabricated using the piezoelectric material $Ba(Ti_{0.95}Zr_{0.05})O_3Mn_{0.003}$. The shape of the piezoelectric element was columnar. $T_{to}$, $T_{to}'$, $T_{to}''$, $T_{ot}$, $T_{ot}'$, and $T_{ot}''$ were 46° C., 44° C., 43° C., 53° C., 54° C., and 56° C., respectively. The polarization treatment was performed by a method in which the temperature of the piezoelectric element was raised from room temperature to 45° C., an electric field of 1.8 kV/mm was applied to the piezoelectric element in the longitudinal direction for 30 minutes in a state where it was held at 45° C., then the temperature was lowered to 35° C., and thereafter the electric field was removed. $k_{33}$ was measured one month after the polarization treatment. The $k_{33}$ value was less than 70% in a temperature range of 0° C. to 60° C. Also, the $k_{33}$ value at 40° C. was 60%.

Comparative Example 4

A piezoelectric element measuring 0.7 mm×0.8 mm×5 mm was fabricated using the piezoelectric material $Ba(Ti_{0.95}Zr_{0.05})O_3Mn_{0.003}$. The shape of the piezoelectric element was columnar. $T_{to}$, $T_{to}'$, $T_{to}''$, $T_{ot}$, $T_{ot}'$, and $T_{ot}''$ were 46° C., 44° C., 43° C., 53° C., 54° C., and 56° C., respectively. The polarization treatment was performed by a method in which the temperature of the piezoelectric element was raised from room temperature to 60° C., an electric field of 1.8 kV/mm was applied to the piezoelectric element in the longitudinal direction for 30 minutes in a state where it was held at 60° C., then the temperature was lowered to 35° C., and thereafter the electric field was removed. $k_{33}$ was measured one month after the polarization treatment. The $k_{33}$ value was less than 70% in a temperature range of 0° C. to 60° C. Also, the $k_{33}$ value at 40° C. was 54%.

Example 5-1

A piezoelectric element measuring 0.7 mm×0.8 mm×5 mm was fabricated using the piezoelectric material $Ba(Ti_{0.95}Zr_{0.05})O_3Mn_{0.003}$. The shape of the piezoelectric element was columnar. $T_{to}$, $T_{to}'$, $T_{to}''$, $T_{ot}$, $T_{ot}'$, and $T_{ot}''$ were 46° C., 44° C., 43° C., 53° C., 54° C., and 56° C., respectively. The polarization treatment was performed by a method in which the temperature of the piezoelectric element was raised from room temperature to 55° C., an electric field of 1.8 kV/mm was applied to the piezoelectric element in the longitudinal direction for 30 minutes in a state where it was held at 55° C., then the temperature was lowered to 35° C., and thereafter the electric field was removed. $k_{33}$ was measured one month after the polarization treatment. A piezoelectric element exhibiting a $k_{33}$ value of 70% or more at 52° C. was obtained. Also, the $k_{33}$ value at 50° C. was 69%.

Example 5-2

A piezoelectric element measuring 0.7 mm×0.8 mm×5 mm was fabricated using the piezoelectric material $Ba(Ti_{0.95}Zr_{0.05})O_3Mn_{0.003}$. The shape of the piezoelectric element was columnar. $T_{to}$, $T_{to}'$, $T_{to}''$, $T_{ot}$, $T_{ot}'$, and $T_{ot}''$ were 46° C., 44° C., 43° C., 53° C., 54° C., and 56° C., respectively. The polarization treatment was performed by a method in which the temperature of the piezoelectric element was raised from room temperature to 45° C., an electric field of 1.8 kV/mm was applied to the piezoelectric element in the longitudinal direction for 30 minutes in a state where it was held at 45° C., then the temperature was lowered to 35° C., and thereafter the electric field was removed. $k_{33}$ was measured one month after the polarization treatment. The $k_{33}$ value was less than 70% in a temperature range of 0° C. to 60° C. Also, the $k_{33}$ value at 50° C. was 60%.

Comparative Example 5

A piezoelectric element measuring 0.7 mm×0.8 mm×5 mm was fabricated using the piezoelectric material $Ba(Ti_{0.95}Zr_{0.05})O_3Mn_{0.003}$. The shape of the piezoelectric element was columnar. $T_{to}$, $T_{to}'$, $T_{to}''$, $T_{ot}$, $T_{ot}'$, and $T_{ot}''$ were 46° C., 44° C., 43° C., 53° C., 54° C., and 56° C., respectively. The polarization treatment was performed by a method in which the temperature of the piezoelectric element was raised from room temperature to 60° C., an electric field of 1.8 kV/mm was applied to the piezoelectric element in the longitudinal direction for 30 minutes in a state where it was held at 60° C., then the temperature was lowered to 35° C., and thereafter the electric field was removed. $k_{33}$ was measured one month after the polarization treatment. The $k_{33}$ value was less than 70% in a temperature range of 0° C. to 60° C. Also, the $k_{33}$ value at 50° C. was 56%.

Example 6

A piezoelectric element measuring 0.7 mm×0.8 mm×5 mm was fabricated using the piezoelectric material $Ba(Ti_{0.95}Zr_{0.05})O_3Mn_{0.003}$. The shape of the piezoelectric element was columnar. $T_{to}$, $T_{to}'$, $T_{to}''$, $T_{ot}$, $T_{ot}'$, and $T_{ot}''$ were 46° C., 44° C., 43° C., 53° C., 54° C., and 56° C., respectively. The polarization treatment was performed by a method in which the temperature of the piezoelectric element was raised from room temperature to 55° C., an electric field of 1.8 kV/mm was applied to the piezoelectric element in the longitudinal direction for 30 minutes in a state where it was held at 55° C., then the temperature was lowered to 35° C., and thereafter the electric field was removed. $k_{33}$ was measured one month after the polarization treatment. The $k_{33}$ value at room temperature (25° C.) was 54%.

Comparative Example 6

A piezoelectric element measuring 0.7 mm×0.8 mm×5 mm was fabricated using the piezoelectric material $Ba(Ti_{0.95}Zr_{0.05})O_3Mn_{0.003}$. The shape of the piezoelectric element was columnar. $T_{to}$, $T_{to}'$, $T_{to}"$, $T_{ot}$, $T_{ot}'$, and $T_{ot}"$ were 46° C., 44° C., 43° C., 53° C., 54° C., and 56° C., respectively. The polarization treatment was performed by a method in which the temperature of the piezoelectric element was raised from room temperature to 60° C., an electric field of 1.8 kV/mm was applied to the piezoelectric element in the longitudinal direction for 30 minutes in a state where it was held at 60° C., then the temperature was lowered to 35° C., and thereafter the electric field was removed. $k_{33}$ was measured one month after the polarization treatment. The $k_{33}$ value at room temperature (25° C.) was 51%.

Comparative Example 7

A piezoelectric element measuring 0.7 mm×0.8 mm×5 mm was fabricated using the piezoelectric material $Ba(Ti_{0.95}Zr_{0.05})O_3Mn_{0.003}$. The shape of the piezoelectric element was columnar. $T_{to}$, $T_{to}'$, $T_{to}"$, $T_{ot}$, $T_{ot}'$, and $T_{ot}"$ were 46° C., 44° C., 43° C., 53° C., 54° C., and 56° C., respectively. The polarization treatment was performed by a method in which the temperature of the piezoelectric element was raised from room temperature to 65° C., an electric field of 1.8 kV/mm was applied to the piezoelectric element in the longitudinal direction for 30 minutes in a state where it was held at 65° C., then the temperature was lowered to 35° C., and thereafter the electric field was removed. $k_{33}$ was measured one month after the polarization treatment. The $k_{33}$ value at room temperature (25° C.) was 48%.

Comparative Example 8

A piezoelectric element measuring 0.7 mm×0.8 mm×5 mm was fabricated using the piezoelectric material $Ba(Ti_{0.95}Zr_{0.05})O_3Mn_{0.003}$. The shape of the piezoelectric element was columnar. $T_{to}$, $T_{to}'$, $T_{to}"$, $T_{ot}$, $T_{ot}'$, and $T_{ot}"$ were 46° C., 44° C., 43° C., 53° C., 54° C., and 56° C., respectively. The polarization treatment was performed by a method in which the temperature of the piezoelectric element was raised from room temperature to 75° C., an electric field of 1.8 kV/mm was applied to the piezoelectric element in the longitudinal direction for 30 minutes in a state where it was held at 75° C., then the temperature was lowered to 35° C., and thereafter the electric field was removed. $k_{33}$ was measured one month after the polarization treatment. The $k_{33}$ value at room temperature (25° C.) was 44%.

| | Temperature $T_{(B \to A)}$ (° C.) at which change from ferroelectric phase B to ferroelectric phase A occurs in temperature lowering process | | | Temperature $T_{(A \to B)}$ (° C.) at which change from ferroelectric phase A to ferroelectric phase B occurs in temperature rising process | | | Polarization (electric field holding) temperature (° C.) | Electric field application finishing temperature (° C.) |
|---|---|---|---|---|---|---|---|---|
| | $T_{(t \to o)}$ | | | $T_{(o \to t)}$ | | | | |
| | $T_{to}"$ | $T_{to}'$ | $T_{to}$ | $T_{ot}$ | $T_{ot}'$ | $T_{ot}"$ | | |
| Example 1-1 | 43 | 44 | 44.5 | 53 | 54 | 56 | 55 | 35 |
| Example 1-2 | 43 | 44 | 44.5 | 53 | 54 | 56 | 55 | 40 |
| Example 2 | 47.5 | 50 | 51.5 | 58.5 | 59.5 | 61 | 55 | 35 |
| Comparative Example 1 | 47.5 | 50 | 51.5 | 58.5 | 59.5 | 61 | 100 | 45 |
| Comparative Example 2 | 47.5 | 50 | 51.5 | 58.5 | 59.5 | 61 | 45 | 35 |

| | Temperature $T_{(B \to A)}$ (° C.) at which change from ferroelectric phase B to ferroelectric phase A occurs in temperature lowering process | | | Temperature $T_{(A \to B)}$ (° C.) at which change from ferroelectric phase A to ferroelectric phase B occurs in temperature rising process | | | Polarization (electric field holding) temperature (° C.) | Electric field application finishing temperature (° C.) | $k_{33}$ measurement temperature (° C.) | $k_{33}$ (%) |
|---|---|---|---|---|---|---|---|---|---|---|
| | $T_{(t \to o)}$ | | | $T_{(o \to t)}$ | | | | | | |
| | $T_{to}"$ | $T_{to}'$ | $T_{to}$ | $T_{ot}$ | $T_{ot}'$ | $T_{ot}"$ | | | | |
| Example 3-1 | 43 | 44 | 46 | 53 | 54 | 56 | 55 | 35 | 36 | 66 |
| Example 3-2 | 43 | 44 | 46 | 53 | 54 | 56 | 45 | 35 | 36 | 57 |
| Comparative Example 3 | 43 | 44 | 46 | 53 | 54 | 56 | 60 | 35 | 36 | 53 |
| Example 4-1 | 43 | 44 | 46 | 53 | 54 | 56 | 55 | 35 | 40 | 67 |
| Example 4-2 | 43 | 44 | 46 | 53 | 54 | 56 | 45 | 35 | 40 | 60 |
| Comparative Example 4 | 43 | 44 | 46 | 53 | 54 | 56 | 60 | 35 | 40 | 54 |

-continued

| | Temperature $T_{(B \to A)}$ (° C.) at which change from ferroelectric phase B to ferroelectric phase A occurs in temperature lowering process | | | Temperature $T_{(A \to B)}$ (° C.) at which change from ferroelectric phase A to ferroelectric phase B occurs in temperature rising process | | | Polarization (electric field holding) temperature | Electric field application finishing temperature | $k_{33}$ measurement temperature | $k_{33}$ |
|---|---|---|---|---|---|---|---|---|---|---|
| | $T_{(t \to o)}$ | | | $T_{(o \to t)}$ | | | | | | |
| | $T_{to}''$ | $T_{to}'$ | $T_{to}$ | $T_{ot}$ | $T_{ot}'$ | $T_{ot}''$ | (° C.) | (° C.) | (° C.) | (%) |
| Example 5-1 | 43 | 44 | 46 | 53 | 54 | 56 | 55 | 35 | 50 | 69 |
| Example 5-2 | 43 | 44 | 46 | 53 | 54 | 56 | 45 | 35 | 50 | 60 |
| Comparative Example 5 | 43 | 44 | 46 | 53 | 54 | 56 | 60 | 35 | 50 | 56 |
| Example 6 | 43 | 44 | 46 | 53 | 54 | 56 | 55 | 35 | Room Temperature | 54 |
| Comparative Example 6 | 43 | 44 | 46 | 53 | 54 | 56 | 60 | 35 | Room Temperature | 51 |
| Comparative Example 7 | 43 | 44 | 46 | 53 | 54 | 56 | 65 | 35 | Room Temperature | 48 |
| Comparative Example 8 | 43 | 44 | 46 | 53 | 54 | 56 | 75 | 35 | Room Temperature | 44 |

Referring FIG. 4 again, it was found that Examples 1-1, 1-2, and 2, in which the temperature at which to start the application of an electric field for performing the polarization treatment was higher than $T_{(t \to o)}$ and lower than $T_{(o \to t)}$, had larger electromechanical coupling coefficients $k_{33}$ than those of Comparative Examples 1 and 2. It was also found that Examples 3 to 6, in which the temperature at which to start the application of an electric field for performing the polarization treatment was higher than $T_{(t \to o)}$ and lower than $T_{(o \to t)}$, maintained larger electromechanical coupling coefficients $k_{33}$ than those of Comparative Examples 3 to 11 even one month after the polarization process.

Here, it is more preferred that $T_{(B \to A)}$ be $T_{BA}$ and $T_{(A \to B)}$ be $T_{AB}'$ when the temperature of the piezoelectric material is raised from a low-temperature side to a temperature range higher than $T_{(B \to A)}$ and lower than $T_{(A \to B)}$ and the application of an electric field is started in a state where the piezoelectric material is held within this temperature range, since in this way a piezoelectric element having a larger electromechanical coupling coefficient $k_{33}$ is obtained.

Examples of $T_{BA}$ include $T_{to}$, and examples of $T_{AB}''$ include $T_{ot}''$. The piezoelectric element of Example 3-1 described above has a larger electromechanical coupling coefficient $k_{33}$ than that of Example 3-2.

Here, examples in which the crystal system changes from tetragonal to orthorhombic have been presented. However, the above applies similarly to other low-temperature side ferroelectric phases and other high-temperature side ferroelectric phases between which a phase transition occurs according to a temperature change.

Example 5

Figure 7:
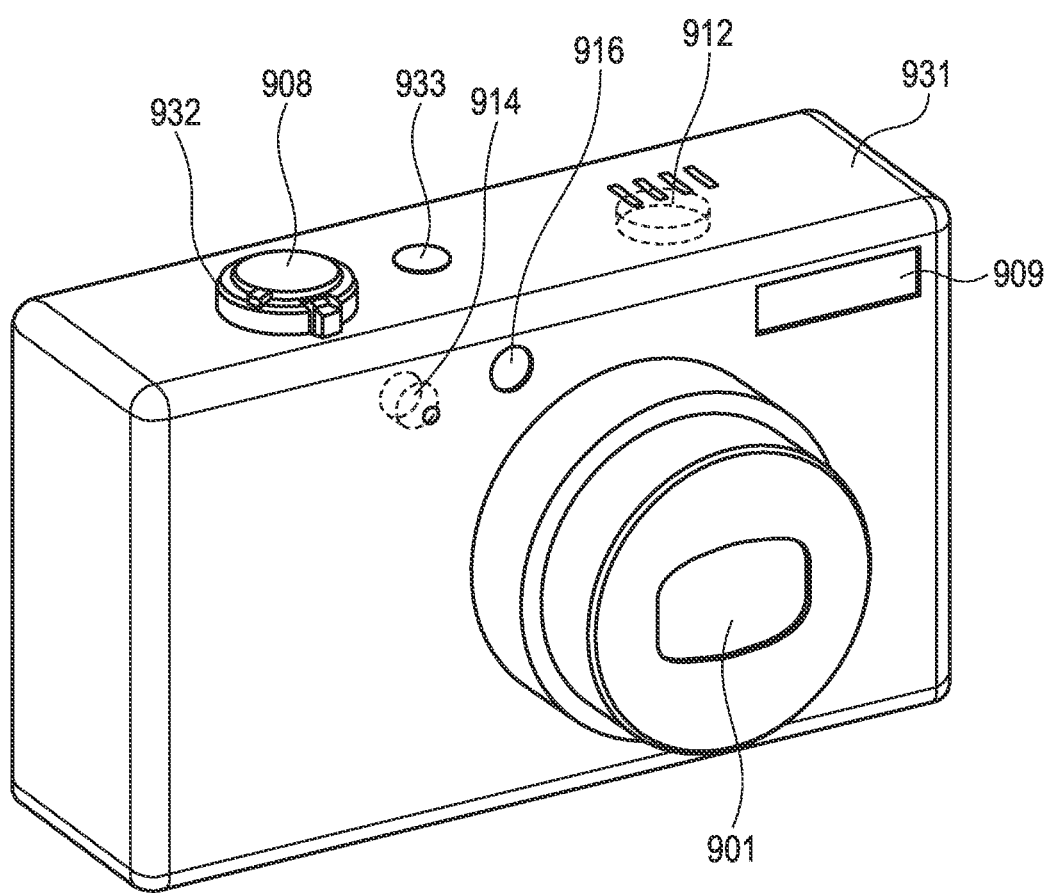
FIG. 7 is a schematic diagram illustrating an embodiment of an electronic device according to the present invention.

The electronic device according to the present invention is characterized in that it includes any one of the above piezoelectric elements. FIG. 7 illustrates an example of an electronic device with members provided with a piezoelectric element manufactured by the method according to the present invention. An optical device 901 includes a release button 908, a flash unit 909, a speaker 912, a microphone 914, and an auxiliary light unit 916. The optical device 901 also has a zoom lever 932 and a power button 933 on a body 931.

According to the present invention, it is possible to provide a piezoelectric element having a larger electromechanical coupling coefficient in a practical temperature range. Also, according to the present invention, it is possible to provide an electronic device using this piezoelectric element.

The piezoelectric material according to the present invention has good piezoelectric properties in a room temperature range. Also, the piezoelectric material according to the present invention contains no lead and thus its load on the environment is small. This enables the piezoelectric material according to the present invention to be used in devices that use a large quantity of a piezoelectric material such as liquid ejection heads, ultrasonic motors, and dust removers without causing problems.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A method of manufacturing a piezoelectric element having an electrode and a piezoelectric material, the piezoelectric material having a ferroelectric phase A at a first temperature and a ferroelectric phase B at a second temperature higher than the first temperature, such that a change from the ferroelectric phase B to the ferroelectric phase A occurs at a phase transition temperature $T_{(B \to A)}$ in a course of temperature decrease and a change from the ferroelectric phase A to the ferroelectric phase B occurs at a phase transition temperature $T_{(A \to B)}$ in a course of temperature increase, where $T_{(A \to B)} > T_{(B \to A)}$, the method comprising:
raising a temperature of the piezoelectric material from an initial temperature, which is lower than $T_{(B \to A)}$, to a temperature range higher than $T_{(B \to A)}$ but lower than $T_{(A \to B)}$;
start applying an electric field to the piezoelectric material in a state where the piezoelectric material is held within the temperature range; and
continue and then stop applying the electric field while the piezoelectric material is at a temperature lower than $T_{(A \to B)}$.

2. The method according to claim 1, wherein the temperature at which application of the electric field is stopped is lower than $T_{(B \to A)}$.

3. The method according to claim 1, wherein $T_{(A \to B)}$ and $T_{(B \to A)}$ are each identified from a value obtained by a second-order differentiation of relative permittivity of the piezoelectric material with temperature.

4. The method according to claim 1, wherein the ferroelectric phase A is an orthorhombic phase, and the ferroelectric phase B is a tetragonal phase.

5. The method according to claim 1, wherein a content of Pb and K in the piezoelectric material is less than 1000 ppm.

6. The method according to claim 1, wherein the piezoelectric material is a perovskite-type metal oxide containing Ba and Ti.

7. The method according to claim 6, wherein:
the piezoelectric material further contains Zr,
a molar ratio x of the Zr to a sum of the Ti and the Zr is $0.02 \leq x \leq 0.13$, and
a molar ratio a of the Ba to the sum of the Ti and the Zr is $0.986 \leq a \leq 1.02$.

8. The method according to claim 1, wherein:
the piezoelectric material contains a perovskite-type metal oxide represented by a general formula (1) and Mn:

$Ba_a(Ti_{1-x}Zr_x)O_3$ . . . (1), where $0.02 \leq x \leq 0.13$ and $0.986 \leq a \leq 1.02$; and a content of the Mn is 0.0020 mole to 0.0150 mole per mole of the metal oxide.

9. The method according to claim 1, wherein the initial temperature is room temperature.

10. A method of manufacturing an electronic device comprising a piezoelectric element, the method comprising providing a member with the piezoelectric element manufactured by the method according to claim 1.

* * * * *